(12) United States Patent
Torregrosa et al.

(10) Patent No.: US 9,035,269 B2
(45) Date of Patent: May 19, 2015

(54) CONTROL MODULE FOR AN ION IMPLANTER

(71) Applicant: ION BEAM SERVICES, Peynier (FR)

(72) Inventors: Frank Torregrosa, Simiane (FR); Laurent Roux, Marseilles (FR)

(73) Assignee: ION BEAM SERVICES, Peynier (FR)

( * ) Notice: Subject to any disclaimer, the term of this patent is extended or adjusted under 35 U.S.C. 154(b) by 0 days.

(21) Appl. No.: 14/349,499

(22) PCT Filed: Oct. 3, 2012

(86) PCT No.: PCT/FR2012/000391
§ 371 (c)(1),
(2) Date: Apr. 3, 2014

(87) PCT Pub. No.: WO2013/050670
PCT Pub. Date: Apr. 11, 2013

(65) Prior Publication Data
US 2014/0353525 A1    Dec. 4, 2014

(30) Foreign Application Priority Data

Oct. 4, 2011    (FR) ..................... 11 03003

(51) Int. Cl.
*H01J 37/24*    (2006.01)
*H01J 37/32*    (2006.01)
*G01R 19/00*    (2006.01)

(52) U.S. Cl.
CPC ......... *H01J 37/243* (2013.01); *H01J 37/32917* (2013.01); *G01R 19/0061* (2013.01); *H01J 37/32174* (2013.01); *H01J 37/32311* (2013.01); *H01J 37/32412* (2013.01); *H01J 37/32422* (2013.01); *H01J 37/32972* (2013.01)

(58) Field of Classification Search
USPC .......................... 250/492.21, 492.2
See application file for complete search history.

(56) References Cited

U.S. PATENT DOCUMENTS

| | | | |
|---|---|---|---|
| 6,237,527 B1 | 5/2001 | Kellerman et al. | |
| 6,433,553 B1 | 8/2002 | Goeckner et al. | |
| 6,632,482 B1 | 10/2003 | Sheng | |
| 2008/0075834 A1 | 3/2008 | Ramaswamy et al. | |
| 2010/0155600 A1 | 6/2010 | Dzengeleski et al. | |
| 2012/0217221 A1* | 8/2012 | Hoffman et al. | 216/61 |
| 2014/0062495 A1* | 3/2014 | Carter et al. | 324/459 |

FOREIGN PATENT DOCUMENTS

| | | |
|---|---|---|
| FR | 2 871 934 A1 | 12/2005 |
| WO | 01/15200 A1 | 3/2001 |

OTHER PUBLICATIONS
International Search Report of PCT/FR2012/000391, dated Jan. 7, 2013.

* cited by examiner

*Primary Examiner* — Kiet T Nguyen
(74) *Attorney, Agent, or Firm* — Sughrue Mion, PLLC

(57) ABSTRACT

A control module for an ion implanter having a power supply, the power supply comprising: an electricity generator HT having its positive pole connected to ground; a first switch SW1 having its first pole connected to the negative pole of the generator HT and having its second pole connected to the outlet terminal S of the power supply; and a second switch SW2 having its first pole connected to the outlet terminal S and having its second pole connected to a neutralization terminal N. The control module also comprises a current measurement circuit AMP for measuring the current that flows between the second pole of the second switch SW2 and the neutralization terminal N.

10 Claims, 2 Drawing Sheets

CONTROL MODULE FOR AN ION IMPLANTER

CROSS REFERENCE TO RELATED APPLICATIONS

This application is a National Stage of International Application No. PCT/FR2012/000391 filed Oct. 3, 2012, claiming priority based on French Patent Application No. 11/03003, filed Oct. 4, 2011, the contents of all of which are incorporated herein by reference in their entirety.

The present invention relates to a control module for an ion implanter.

The field of the invention is that of ion implanters operating in plasma immersion mode. Thus, implanting ions in a substrate consists in immersing the substrate in a plasma and in biasing it with a negative voltage of a few tens of volts to a few tens of kilovolts (generally less than 100 kV), so as to create an electric field capable of accelerating the ions of the plasma towards the substrate so that they become implanted therein. The atoms implanted in this way are referred to as "dopants".

The penetration depth of the ions is determined by their acceleration energy. It depends firstly on the voltage applied to the substrate and secondly on the respective natures of the ions and of the substrate. The concentration of implanted atoms depends on the dose, which is expressed as a number of ions per square centimeter, and on the implantation depth.

One of the essential parameters when performing implantation is the dose of dopant that is implanted. This dose needs to be known accurately. It is generally estimated by means of the power supply current delivered by the bias generator.

Consideration is given below to the situation in which the bias to the substrate is pulsed.

With reference to FIG. 1, document WO01/15200 proposes biasing the substrate by means of a power supply that comprises:
- a generator GEN having its positive pole connected to ground;
- a first switch IT1 having its first pole connected to the negative pole of the generator GEN and having its second pole connected to the output terminal O of the power supply; and
- a second switch IT2 having its first pole connected to the output terminal O and having its second pole connected to ground.

When the first switch IT1 is open and the second switch IT2 is closed, a displacement current is produced that is due to the equivalent capacitance of the implanter.

This equivalent capacitance is the sum of all the stray capacitances of the machine:
- the capacitance of the cables;
- the capacitance between parts that are biased and parts that are grounded, in particular the capacitance between the substrate carrier platen and the implantation chamber;
- the capacitance of the isolating transformers; and
- the capacitance of the plasma sheath.

It is found that the displacement current is current that is of no use for implantation but that is nevertheless drawn from the power supply current.

When estimating the implanted dose, it is therefore appropriate to take account of this displacement current in order to subtract it from the power supply current.

Thus, document U.S. Pat. No. 6,433,553 proposes arranging a measurement capacitance Cm in parallel with the substrate carrier.

This measurement capacitance Cm ought to be equal to the equivalent capacitance of the implanter, however it is practically impossible to determine that equivalent capacitance.

Furthermore, the displacement current Id is the derivative of the charge Q with respect to time:

$$Id = dQ/dt$$

The charge Q is the product of the voltage V multiplied by the measurement capacitance:

$$Q = Cm \cdot V$$

Thus:

$$Id = Cm \cdot dV/dt + V \cdot dCm/dt$$

The above-mentioned document takes account solely of the first term from the above equation. It assumes that the equivalent capacitance is constant, which is not true, in particular because of variations of the plasma sheath.

Thus, an object of the present invention is to determine the displacement current more accurately.

The invention provides a control module for an ion implanter having a power supply, the power supply comprising:
- an electricity generator having its positive pole connected to ground;
- a first switch having its first pole connected to the negative pole of the generator and having its second pole connected to the outlet terminal of the power supply; and
- a second switch having its first pole connected to the outlet terminal and having its second pole connected to a neutralization terminal;
- in addition, the control module includes a current measurement circuit for measuring the current that flows between the second pole of the second switch and the neutralization terminal.

The displacement current flows between the substrate carrier platen and the neutralization terminal.

In a first option, the neutralization terminal is connected to ground.

In a second option, the neutralization terminal is connected to the positive pole of a voltage source having its negative pole connected to ground.

In a first embodiment, the current measurement circuit is a coil surrounding the cable connecting the second pole of the second switch to the neutralization terminal.

In a second embodiment, the current measurement circuit comprises a measurement resistor connected between the second pole of the second switch and the neutralization pole, an integration capacitor in parallel with the measurement resistor, and a voltage measuring circuit likewise in parallel with the measurement resistor.

Advantageously, the control module further includes a regulation capacitor arranged between the negative pole of the generator and ground.

Thus, the control module includes a module for estimating the implantation current delivered by the generator and it further includes a control circuit for estimating the implantation current by differentiating the power supply current and the displacement current.

Furthermore, since the implantation current is thus the difference between the power supply current and the displacement current, the implantation current does not represent only the implanted ion current.

The positive charges are not due solely to the positive ions that reach the substrate, but they also come from the generation of secondary electrons that are released from the surface of the substrate.

On ion beam implanters, secondary electrons have little energy, such that they can be taken towards the substrate by means of a Faraday cage surrounding it, the cage being optically closed by a negative potential barrier.

In an implanter operating in plasma immersion mode, the secondary electrons are accelerated with energy that is substantially identical to the energy of the positive ions of the plasma, which makes it much more difficult to bring them back towards the substrate.

Another object of the present invention is thus to take account of the contribution of secondary electrons to the implantation current.

According to the invention, the control module includes a module for estimating the power supply current delivered by the generator and receiving a disturbance current delivered by a secondary electron detector, and it further includes a control circuit for estimating the ion current by subtracting the displacement current and the disturbance current from the power supply current.

Furthermore, when the control circuit receives the proportion of a predetermined ion species from a spectrometer, the control circuit allocates the proportion to the ion current in order to estimate the implanted dose.

The invention also provides an ion implanter provided with a control module and having a substrate carrier platen, the outlet terminal of the power supply being connected to the substrate carrier platen.

The present invention appears below in greater detail in the context of the following description of an implementation given by way of illustration and with reference to the accompanying figures, in which.

Elements shown in more than one of the figures are given the same references in each of them.

Figure 1:
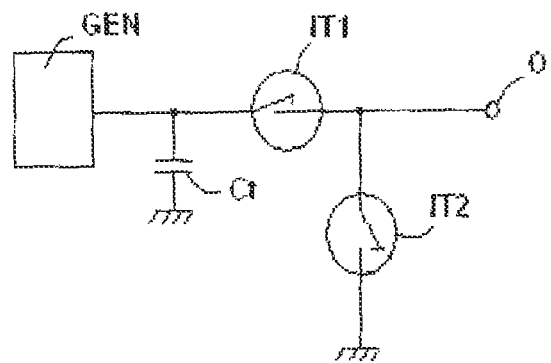
FIG. 1 shows a high-voltage power supply of the prior art.
Figure 2:
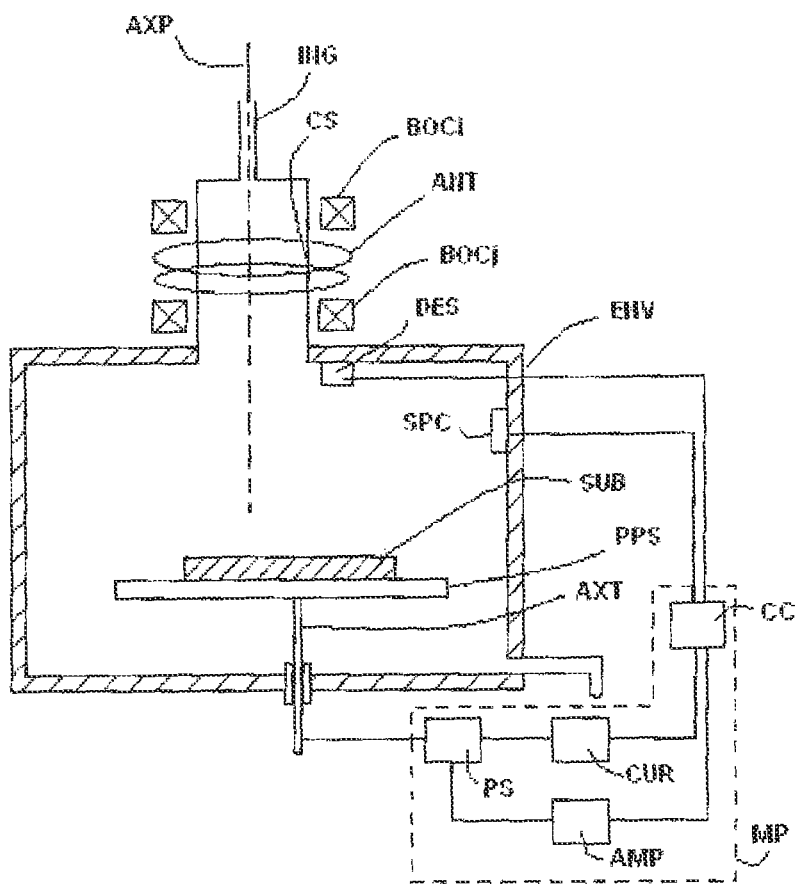
FIG. 2 shows an ion implanter provided with a control module.

With reference to FIG. 2, an ion implanter comprises a plurality of elements arranged inside and outside a vacuum enclosure ENV. For microelectronics applications, it is recommended to use an enclosure made of alumina alloy if it is desired to limit contamination by metallic elements such as iron, chromium, nickel, or cobalt. It is also possible to use a coating of silicon or of silicon carbide.

A substrate carrier platen PPS, is in the form of a disk in a horizontal plane that is rotatable about its vertical axis AXT, and it receives the substrate SUB that is to be subjected to ion implantation.

The top portion of the enclosure ENV receives the source body CS, that is cylindrical and on the vertical axis AXP. This body is made of quartz. It is surrounded externally, firstly by confinement coils BOCi and BOCj, and secondly by an external radio-frequency antenna ANT. The inlet ING for the plasma-generating gas is coaxial with the vertical axis AXP of the source body CS. This vertical axis AXP meets the surface of the substrate carrier platen PPS on which the substrate SUB for implanting is placed.

It is possible to use any type of pulsed plasma source: inductively coupled plasma (ICP), helicon, microwave, arc. These sources need to operate at pressure levels that are low enough to ensure that the electric field created between the platen PPS at high voltage and the enclosure ENV at ground potential does not ignite a discharge plasma that would disturb the pulsed operation of the source.

The implanter also includes a secondary electron detector DES arranged facing the substrate SUB. It also includes a spectrometer SPC arranged in the enclosure ENV, e.g. a mass spectrometer or an optical spectrometer. The spectrometer identifies the proportion of the implanted species in the plasma.

The control module MP of the implanter essentially comprises four elements:
- a high voltage electrical power supply PS;
- a displacement current measuring circuit AMP;
- a member CUR for estimating power supply current; and
- a control circuit CC.

Figure 3:
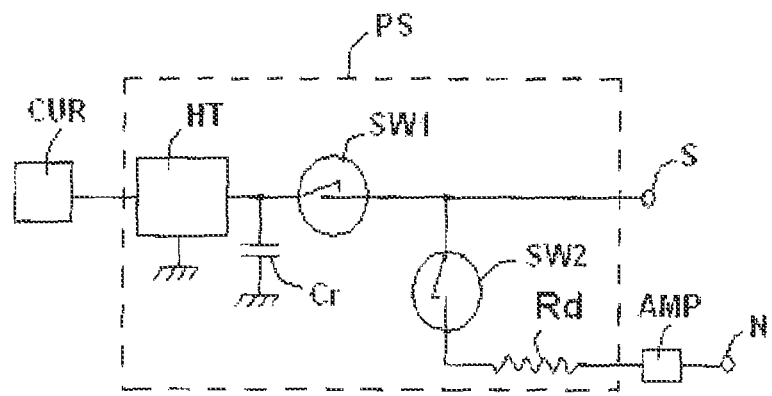
FIG. 3 shows a high-voltage electricity power supply in accordance with the invention.

With reference to FIG. 3, the power supply PS comprises:
- a high voltage generator HT having its positive pole connected to ground;
- a first switch SW1 having its first pole connected to the negative pole of the generator HT and having its second pole connected to the output terminal S of the power supply;
- a second switch SW2 having its first pole connected to the output terminal S and having its second pole connected to a neutralization terminal N, either directly or else via a discharge resistor Rd, typically having a resistance of 1 kilohm (kΩ); and
- preferably, a regulation capacitor Cr connected in parallel with the generator HT.

The output terminal S is connected to the substrate carrier platen PPS of the implanter.

The member CUR for estimating the power supply current, the equivalent of an ammeter, gives a measurement of the power supply current delivered by the generator HT to the substrate carrier platen PPS.

The neutralization terminal may be connected to ground. It may also be connected to the positive pole of a voltage source having its negative pole connected to ground. This positive voltage is selected to be substantially equal to the plasma potential, which generally lies in the range +10 volts (V) to +20 V.

A current measuring circuit AMP measures the displacement current flowing between the second pole of the second switch SW2 and the neutralization terminal N.

In a first embodiment, this current measurement circuit is a coil surrounding the cable that conveys the displacement current. That provides a measurement of instantaneous current, and it happens that this current varies extremely quickly. In order to avoid having recourse to fast measurement electronics, it is preferred to measure the mean value of this current.

Figure 4:
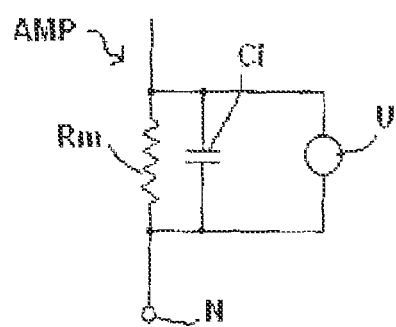
FIG. 4 shows an embodiment of the current measuring circuit.

Thus, with reference to FIG. 4, in a second embodiment, the current measuring circuit AMP is an averaging circuit. It comprises a measurement resistor Rm connected between the second pole of the second switch SW2 and the neutralization pole, an integration capacitor Ci in parallel with the measurement resistor Rm, and a voltage measuring circuit U also in parallel with the measurement resistor Rm. The measured voltage represents the mean value of the displacement current. The measurement resistor Rm must have a resistance such that the voltage across its terminals is sufficient to be easily measured with accuracy. A typical resistance is about 10 ohms (Ω).

Returning to FIG. 2, the control module MP thus includes the control circuit CC that receives the power supply current delivered by the member CUR for estimating current and that also receives the displacement current as supplied by the measurement circuit AMP. It takes the difference between these two currents in order to calculate the implantation current, which is a much better representation of the implanted dose than is the power supply current.

The measurement of the dose is refined as follows.

The control circuit also receives the disturbance current delivered by the secondary electron detector DES and it then calculates the ion current by subtracting the displacement current and the disturbance current from the power supply current.

The measurement of the dose is further improved significantly by means of the spectrometer SPC. The control circuit receives therefrom the proportion of the plasma that is constituted by the implanted species, and it multiplies this proportion by the ion current in order to give an estimate of the dose.

The above-described implementation of the invention has been selected because of its concrete nature. Nevertheless, it is not possible to list exhaustively all possible implementations covered by the invention. In particular, any of the means described may be replaced by equivalent means without going beyond the ambit of the present invention.

The invention claimed is:

1. A control module for an ion implanter having a power supply, the power supply comprising:
    an electricity generator (HT) having its positive pole connected to ground;
    a first switch (SW1) having its first pole connected to the negative pole of said generator (HT) and having its second pole connected to the outlet terminal (S) of the power supply; and
    a second switch (SW2) having its first pole connected to said outlet terminal (S) and having its second pole connected to a neutralization terminal (N);
    the control module being characterized in that it includes a current measurement circuit (AMP) for measuring the displacement current that flows between the second pole of said second switch (SW2) and said neutralization terminal (N).

2. A control module according to claim 1, characterized in that said neutralization terminal (N) is connected to ground.

3. A control module according to claim 1, characterized in that said neutralization terminal (N) is connected to the positive pole of a voltage source having its negative pole connected to ground.

4. A control module according to claim 1, characterized in that said current measurement circuit (AMP) is a coil surrounding the cable connecting the second pole of said second switch (SW2) to said neutralization terminal (N).

5. A control module according to claim 1, characterized in that said current measurement circuit (AMP) comprises a measurement resistor (Rm) connected between the second pole of the second switch (SW2) and said neutralization pole (N), an integration capacitor (Ci) in parallel with said measurement resistor (Rm), and a voltage measuring circuit (U) likewise in parallel with the measurement resistor (Rm).

6. A control module according to claim 1, characterized in that it further includes a regulation capacitor (Cr) arranged between the negative pole of said generator (HT) and ground.

7. A control module according to claim 1, characterized in that it includes a member (CUR) for estimating the power supply current delivered by said generator (HT) and it further includes a control circuit (CC) for estimating the implantation current by differentiating said power supply current and said displacement current (AMP).

8. A control module according to claim 1 characterized in that it includes a member (CUR) for estimating the implantation current delivered by said generator (HT) and receiving a disturbance current delivered by a secondary electron detector (DES), and it further includes a control circuit (CC) for estimating the ion current by subtracting said displacement current (AMP) and said disturbance current from said power supply current.

9. A control module according to claim 8, characterized in that said control circuit (CC) also receives the proportion of a predetermined ion species as determined by a spectrometer (SPC), and said control circuit (CC) allocates said proportion to said ion current in order to estimate the implanted dose.

10. An ion implanter provided with a control module according to claim 1 and characterized in that it has a substrate carrier platen (PPS) with the outlet terminal (S) of said power supply (PS) connected to said substrate carrier platen (PPS).

* * * * *